United States Patent
Fu et al.

(10) Patent No.: US 10,690,907 B2
(45) Date of Patent: Jun. 23, 2020

(54) SCANNER HAVING PIEZOELECTRIC ELEMENTS

(71) Applicant: Ultimems, Inc., New Taipei (TW)

(72) Inventors: Yee-Chung Fu, Fremont, CA (US); Han-Tang Su, Taichung (TW)

(73) Assignee: ULTIMEMS, INC., New Taipei (TW)

( * ) Notice: Subject to any disclaimer, the term of this patent is extended or adjusted under 35 U.S.C. 154(b) by 287 days.

(21) Appl. No.: 15/892,443

(22) Filed: Feb. 9, 2018

(65) Prior Publication Data
US 2019/0250397 A1  Aug. 15, 2019

(51) Int. Cl.
*G02B 26/08* (2006.01)
*G02B 26/10* (2006.01)
(Continued)

(52) U.S. Cl.
CPC ....... *G02B 26/0858* (2013.01); *G02B 26/105* (2013.01); *H02N 2/10* (2013.01);
(Continued)

(58) Field of Classification Search
CPC ............ G02B 26/0858; G02B 26/105; G02B 26/101; G02B 26/0833; G02B 26/085; G02B 26/10; G02B 26/0841; G02B 26/08; G02B 26/103; G02B 27/0101; B81B 2201/04; B81B 2201/032; B81B 3/0045; B81B 3/0043; G01S 7/4817; G01S 7/42; G01S 17/10; H04N 9/3161; H04N 5/2254;
(Continued)

(56) References Cited

U.S. PATENT DOCUMENTS

| | | | |
|---|---|---|---|
| 7,282,775 B2 | 10/2007 | Fu | |
| 7,732,990 B2 * | 6/2010 | Nishigaki | B81B 3/0072 310/317 |

(Continued)

FOREIGN PATENT DOCUMENTS

CN  1961230 A  *  5/2007

*Primary Examiner* — William R Alexander
*Assistant Examiner* — Tamara Y. Washington
(74) *Attorney, Agent, or Firm* — Chen-Chi Lin (57) ABSTRACT

A scanner comprises a mirror, a first and second springs, an insulation layer and a first and second piezoelectric elements. The insulation layer is directly attached to the mirror and the first and second springs. The first and second piezoelectric elements are directly attached to the insulation layer. The first piezoelectric element has a first portion above the first spring, a mid-range portion above the mirror and a second portion above the second spring. The second piezoelectric element has a first portion above the first spring, a mid-range portion above the mirror and a second portion above the second spring. The first piezoelectric element has a first upper electrode layer, a first piezoelectric layer and a first lower electrode layer. The second piezoelectric element has a second upper electrode layer, a second piezoelectric layer and a second lower electrode layer. The first upper electrode layer of the first piezoelectric element and the second lower electrode layer of the second piezoelectric element are electrically connected to a first electrode. The first lower electrode layer of the first piezoelectric element and the second upper electrode layer of the second piezoelectric element are electrically connected to a second electrode.

6 Claims, 6 Drawing Sheets

(51) Int. Cl.
*G02B 26/12* (2006.01)
*H02N 2/10* (2006.01)
*H01L 41/053* (2006.01)
*H01L 41/187* (2006.01)

(52) U.S. Cl.
CPC ........ *H01L 41/0536* (2013.01); *H01L 41/187* (2013.01); *H01L 41/1871* (2013.01); *H01L 41/1875* (2013.01); *H01L 41/1876* (2013.01)

(58) Field of Classification Search
CPC ... H04N 5/2256; H04N 9/3129; H04N 9/3164
USPC ................................. 359/200.8, 196.1–202.1
See application file for complete search history.

(56) References Cited

U.S. PATENT DOCUMENTS

| | | | | |
|---|---|---|---|---|
| 2004/0095046 | A1* | 5/2004 | Ouchi | G01C 19/5607 310/370 |
| 2006/0119227 | A1* | 6/2006 | Ikehashi | H01G 5/18 310/348 |
| 2006/0226934 | A1* | 10/2006 | Ohguro | H01H 59/0009 335/78 |
| 2007/0228887 | A1* | 10/2007 | Nishigaki | B81B 3/0072 310/332 |
| 2011/0024274 | A1* | 2/2011 | Yoshihara | B81B 3/0021 200/181 |
| 2012/0206134 | A1* | 8/2012 | Fischer | G01R 33/072 324/244 |

* cited by examiner

SCANNER HAVING PIEZOELECTRIC ELEMENTS

INCORPORATION BY REFERENCE

U.S. Pat. No. 7,282,775B2 to Fu is hereby incorporated by reference.

FIELD OF THE INVENTION

This invention relates generally to a Micro-Electro Mechanical Systems (MEMS) scanner. More particularly, the present invention relates to a MEMS scanner having piezoelectric elements for suppressing mirror dynamic deformations.

BACKGROUND OF THE INVENTION

FIG. 3 of U.S. Pat. No. 7,282,775B2 to Fu shows dynamic deformation of a mirror of a MEMS scanner. Dynamic deformation of a mirror degrades optical resolution and performance. U.S. Pat. No. 7,282,775B2 to Fu introduces mirror support attachment structures to reduce mirror dynamic deformation. The present invention introduces piezoelectric elements for suppressing mirror dynamic deformations.

SUMMARY OF THE INVENTION

This invention discloses a scanner comprising a mirror, a first and second springs, an insulation layer and a first and second piezoelectric elements. The insulation layer is directly attached to the mirror and the first and second springs. The first and second piezoelectric elements are directly attached to the insulation layer. The first piezoelectric element has a first portion above the first spring, a mid-range portion above the mirror and a second portion above the second spring. The second piezoelectric element has a first portion above the first spring, a mid-range portion above the mirror and a second portion above the second spring. The first piezoelectric element has a first upper electrode layer, a first piezoelectric layer and a first lower electrode layer. The second piezoelectric element has a second upper electrode layer, a second piezoelectric layer and a second lower electrode layer. The first upper electrode layer of the first piezoelectric element and the second lower electrode layer of the second piezoelectric element are electrically connected to a first electrode. The first lower electrode layer of the first piezoelectric element and the second upper electrode layer of the second piezoelectric element are electrically connected to a second electrode.

DETAILED DESCRIPTION OF THE INVENTION

Figure 1:
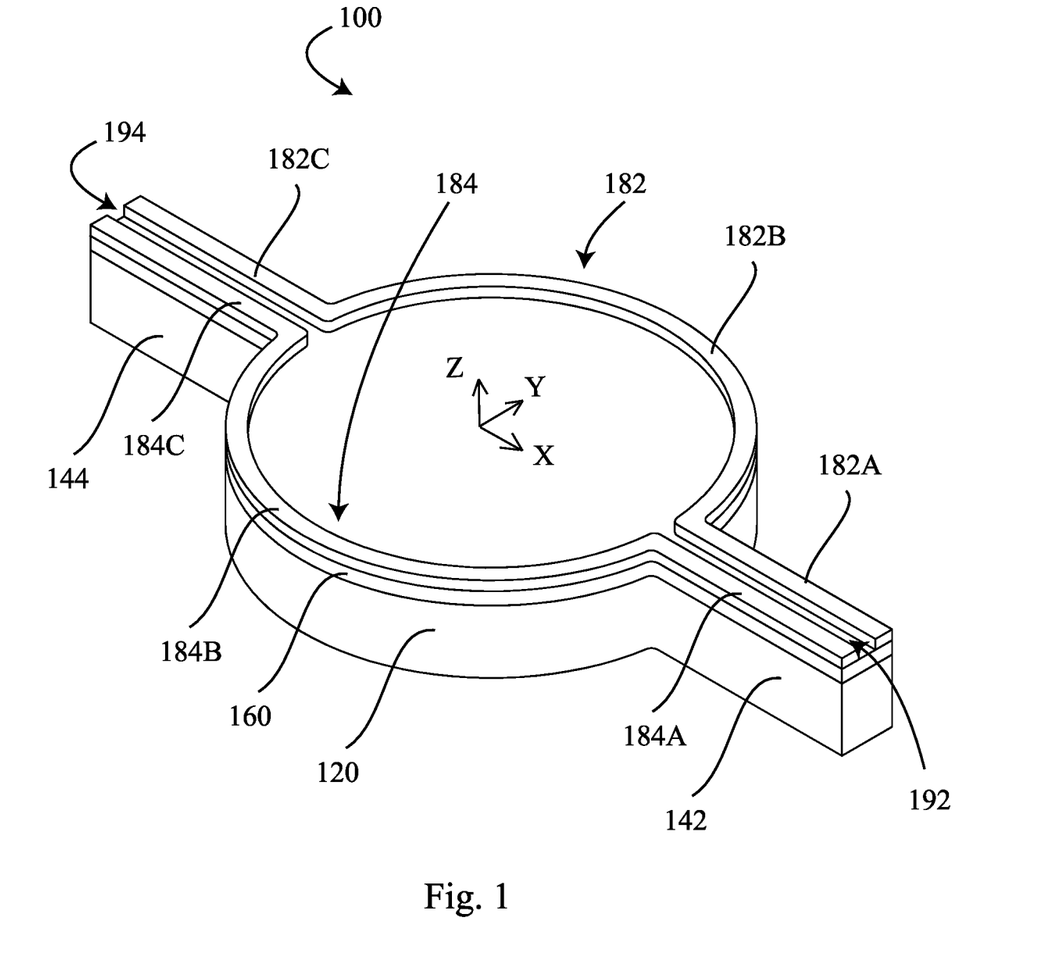
FIG. 1 is a schematic perspective view of a scanner in examples of the present disclosure.

FIG. 1 is a schematic perspective view of a scanner 100 in examples of the present disclosure. The scanner 100 comprises a mirror 120, a first spring 142, a second spring 144, an insulation layer 160, a first piezoelectric element 182 and a second piezoelectric element 184. The mirror 120 rotates about the X-axis. In examples of the present disclosure, the mirror 120 is of an oval shape. The first spring 142 is connected to the mirror 120. The second spring 144 is connected to the mirror 120. In examples of the present disclosure, the first spring 142 and the second spring 144 are aligned along the X-axis. The insulation layer 160 is directly attached to the mirror 120, the first spring 142 and the second spring 144. In examples of the present disclosure, the insulation layer 160 is a single-piece construction.

The first piezoelectric element 182 and the second piezoelectric element 184 are directly attached to the insulation layer 160. In Z-direction, the first piezoelectric element 182 has a first portion 182A above the first spring 142, a mid-range portion 182B above the mirror 120 and a second portion 182C above the second spring 144. The second piezoelectric element 184 has a first portion 184A above the first spring 142, a mid-range portion 184B above the mirror 120 and a second portion 184C above the second spring 144. An outer edge of the mid-range portion 182B of the first piezoelectric element 182 is generally aligned with a first section of a perimeter of a top surface of the mirror 120. An outer edge of the mid-range portion 184B of the second piezoelectric element 184 is generally aligned with a second section of the perimeter of the top surface of the mirror 120. An outer edge of the first portion 182A of the first piezoelectric element 182 is generally aligned with a first section of a perimeter of a top surface of the first spring 142. An outer edge of the first portion 184A of the second piezoelectric element 184 is generally aligned with a second section of the perimeter of the top surface of the first spring 142. An outer edge of the second portion 182C of the first piezoelectric element 182 is generally aligned with a first section of a perimeter of a top surface of the second spring 144. An outer edge of the second portion 184C of the second piezoelectric element 184 is generally aligned with a second section of the perimeter of the top surface of the second spring 144.

In examples of the present disclosure, the insulation layer 160 is made of a silicon oxide material. In one example, the first piezoelectric element 182 and the second piezoelectric element 184 are symmetric with respect to the X-axis. In another example, the first piezoelectric element 182 is symmetric with respect to the Y-axis. The second piezoelectric element 184 is symmetric with respect to the Y-axis.

In one example, the first piezoelectric element 182 and the second piezoelectric element 184 are made of lead zirconate titanate (PZT). In another example, the first piezoelectric element 182 and the second piezoelectric element 184 are made of lead magnesium niobate-lead titanate (PMN-PT). In yet another example, the first piezoelectric element 182 and the second piezoelectric element 184 are made of aluminum nitride. In still another example, the first piezoelectric element 182 and the second piezoelectric element 184 are made of Barium titanate.

In examples of the present disclosure, a width of a gap 192 between the first portion 182A of the first piezoelectric element 182 and the first portion 184A of the second piezoelectric element 184 is at least four micro-meters. A width of a gap 194 between the second portion 182C of the first piezoelectric element 182 and the second portion 184C of the second piezoelectric element 184 is at least four micro-meters.

The first piezoelectric element 182 has a first upper electrode layer, a first piezoelectric layer and a first lower electrode layer. The second piezoelectric element 184 has a second upper electrode layer, a second piezoelectric layer and a second lower electrode layer. The first upper electrode layer of the first piezoelectric element 182 and the second lower electrode layer of the second piezoelectric element 184 are electrically and mechanically connected to a first electrode. The first lower electrode layer of the first piezoelectric element 182 and the second upper electrode layer of the second piezoelectric element 184 are electrically and mechanically connected to a second electrode. A first excitation voltage is applied at the first electrode and a second excitation voltage is applied at the second electrode. The first excitation voltage is a first function of time. The second excitation voltage is a second function of time. In examples of the present disclosure, the first function of time is a sinusoidal function of time and the second function of time is another sinusoidal function of time. The first excitation voltage and the second excitation voltage have a same frequency in a range from 98% to 100% of a fundamental frequency of the mirror 120. In examples of the present disclosure, a difference between the first excitation voltage and the second excitation voltage is a function of a rotation angle of the mirror 120. In examples of the present disclosure, the function includes a phase lead value or a phase lag value.

A rotation of the mirror 120 is characterized by a positive rotation angle condition in which the first piezoelectric element 182 is under tension and the second piezoelectric element 184 is under compression. The rotation of the mirror 120 is further characterized by a negative rotation angle condition in which the first piezoelectric element 182 is under compression and the second piezoelectric element 184 is under tension.

Figure 2:
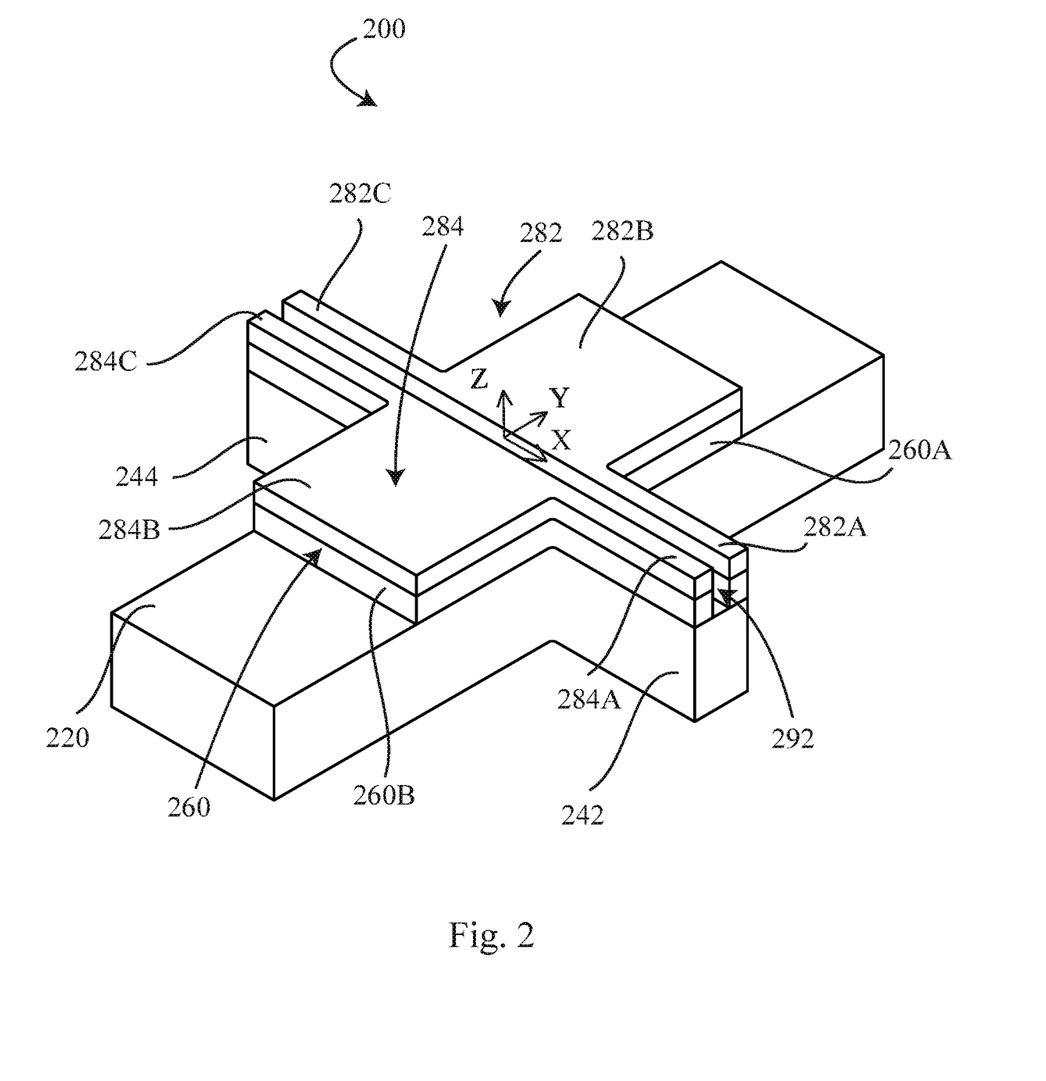
FIG. 2 is a schematic perspective view of another scanner in examples of the present disclosure.

FIG. 2 is a schematic perspective view of a scanner 200 in examples of the present disclosure. The scanner 200 comprises a mirror 220, a first spring 242, a second spring 244, an insulation layer 260, a first piezoelectric element 282 and a second piezoelectric element 284. The mirror 220 rotates about an axis parallel to the X-axis. In examples of the present disclosure, the mirror 220 is of a rectangular shape. The first spring 242 is connected to the mirror 220. The second spring 244 is connected to the mirror 220. In examples of the present disclosure, the first spring 242 and the second spring 244 are aligned along the axis parallel to the X-axis. The insulation layer 260 is directly attached to the mirror 220, the first spring 242 and the second spring 244. In examples of the present disclosure, the insulation layer 260 has a first component 260A and a second component 260B separated from the first component 260A. The first component 260A is between the first piezoelectric element 282 and the mirror 220. The second component 260B is between the second piezoelectric element 284 and the mirror 220.

The first piezoelectric element 282 and the second piezoelectric element 284 are directly attached to the insulation layer 260. In Z-direction, the first piezoelectric element 282 has a first portion 282A above the first spring 242, a mid-range portion 282B above the mirror 220 and a second portion 282C above the second spring 244. The second piezoelectric element 284 has a first portion 284A above the first spring 242, a mid-range portion 284B above the mirror 220 and a second portion 284C above the second spring 244. The first piezoelectric element 282 and the second piezoelectric element 284 are separated by a gap 292. The gap 292 has a longitudinal direction parallel to the X-axis. In examples of the present disclosure, the gap 292 has a constant width. A top surface area of the mid-range portion 282B of the first piezoelectric element 282 is between twenty percent and thirty percent of a top surface area of the mirror 220.

In examples of the present disclosure, the insulation layer 260 is made of a silicon oxide material. In one example, the first piezoelectric element 282 and the second piezoelectric element 284 are symmetric with respect to the X-axis. In another example, the first piezoelectric element 282 is symmetric with respect to the Y-axis. The second piezoelectric element 284 is symmetric with respect to the Y-axis.

In examples of the present disclosure, a width of a gap 292 between the first portion 282A of the first piezoelectric element 282 and the first portion 284A of the second piezoelectric element 284 is at least four micro-meters. A width of a gap 292 between the second portion 282C of the first piezoelectric element 282 and the second portion 284C of the second piezoelectric element 284 is at least four micro-meters.

Figure 3:
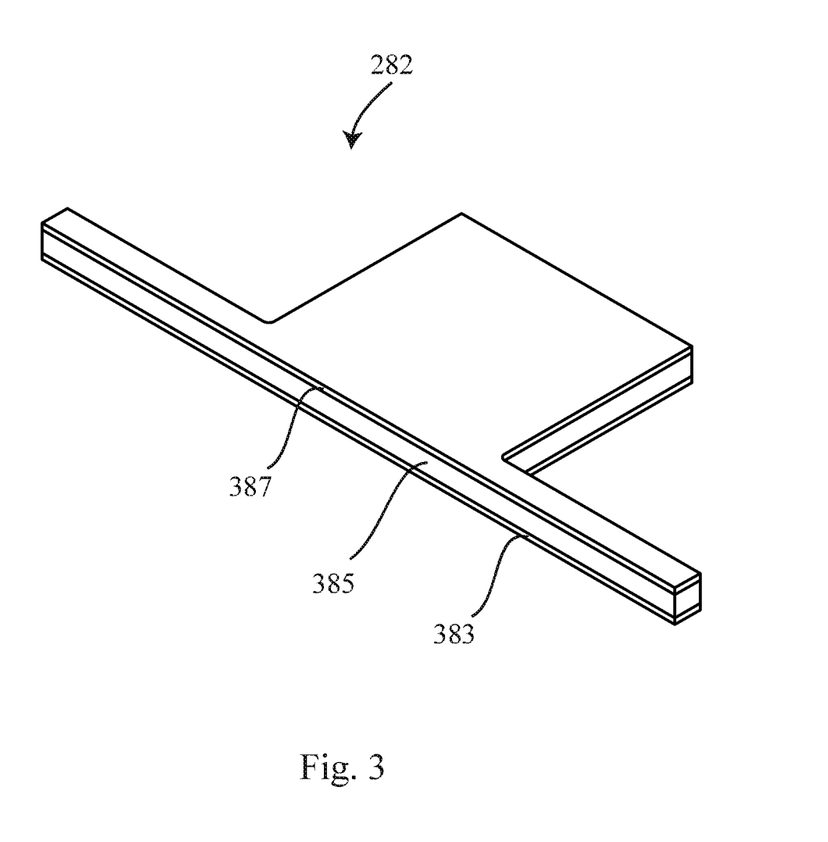
FIG. 3 is a schematic perspective view of a piezoelectric element in examples of the present disclosure.

The first piezoelectric element 282 has a first upper electrode layer 387 of FIG. 3, a first piezoelectric layer 385 of FIG. 3 and a first lower electrode layer 383 of FIG. 3. The second piezoelectric element 284 has a second upper electrode layer, a second piezoelectric layer and a second lower electrode layer. The first upper electrode layer 387 of FIG. 3 of the first piezoelectric element 282 and the second lower electrode layer of the second piezoelectric element 284 are electrically and mechanically connected to a first electrode. The first lower electrode layer 383 of FIG. 3 of the first piezoelectric element 282 and the second upper electrode layer of the second piezoelectric element 284 are electrically and mechanically connected to a second electrode. A first excitation voltage is applied at the first electrode and a second excitation voltage is applied at the second electrode. The first excitation voltage is a first function of time. The second excitation voltage is a second function of time. In examples of the present disclosure, the first function of time is a sinusoidal function of time and the second function of time is another sinusoidal function of time. The first excitation voltage and the second excitation voltage have a same frequency in a range from 98% to 100% of a fundamental frequency of the mirror 220. In examples of the present disclosure, a difference between the first excitation voltage and the second excitation voltage is a function of a rotation angle of the mirror 220. In examples of the present disclosure, the function includes a phase lead value or a phase lag value.

A rotation of the mirror 220 is characterized by a positive rotation angle condition in which the first piezoelectric element 282 is under tension and the second piezoelectric element 284 is under compression. The rotation of the mirror 220 is further characterized by a negative rotation angle condition in which the first piezoelectric element 282 is under compression and the second piezoelectric element 284 is under tension.

Figure 4:
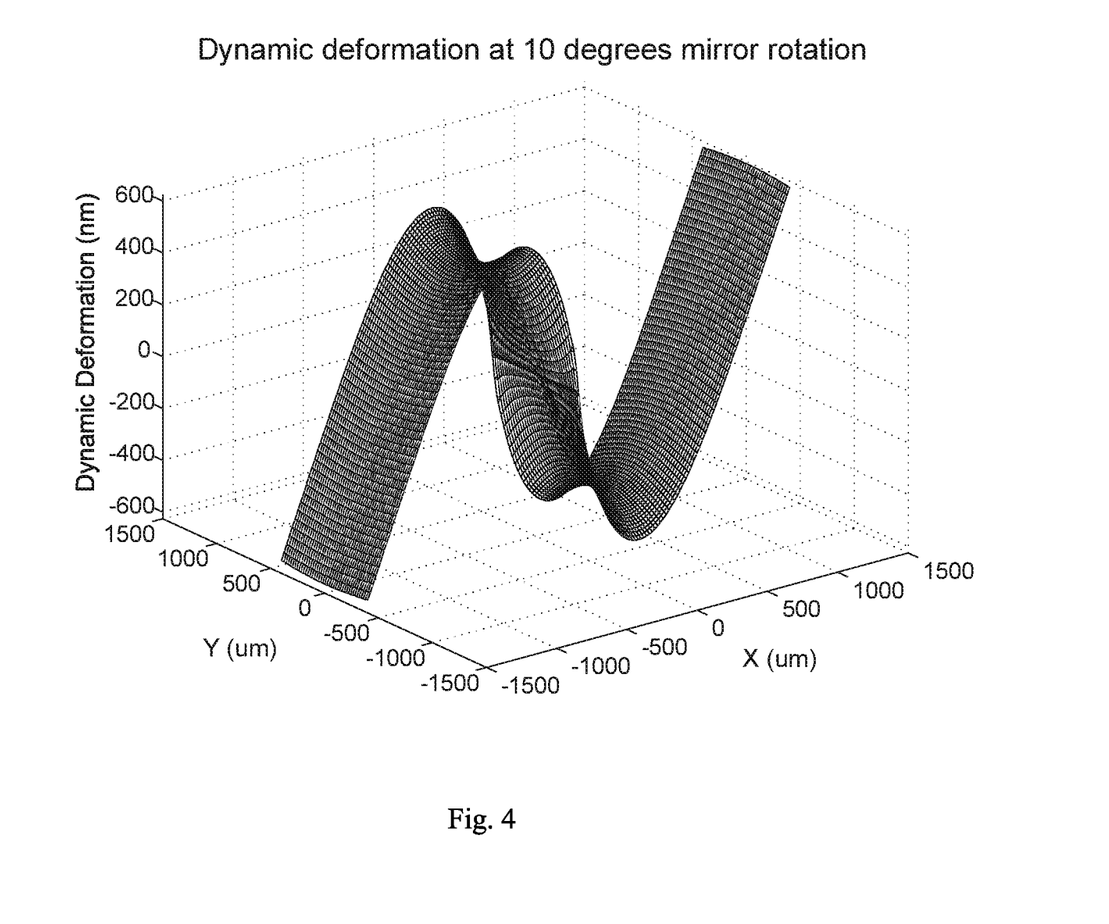
FIG. 4 shows dynamic deformations of a rectangular mirror in examples of the present disclosure.

FIG. 4 shows dynamic deformations of a rectangular mirror in examples of the present disclosure. The dynamic deformations are calculated by simulation software. In examples of the present disclosure, the mirror is a 3,000 um by 800 um rectangular mirror. The mirror is 100 um thick.

The fundamental frequency of the mirror is 7,148 Hz. The first piezoelectric element 282 of FIG. 2 is 1 um thick. The second piezoelectric element 284 of FIG. 2 is 1 um thick. The mirror rotation angle is +/−10 degrees. The maximum dynamic deformation is +/−626 nm.

Figure 5:
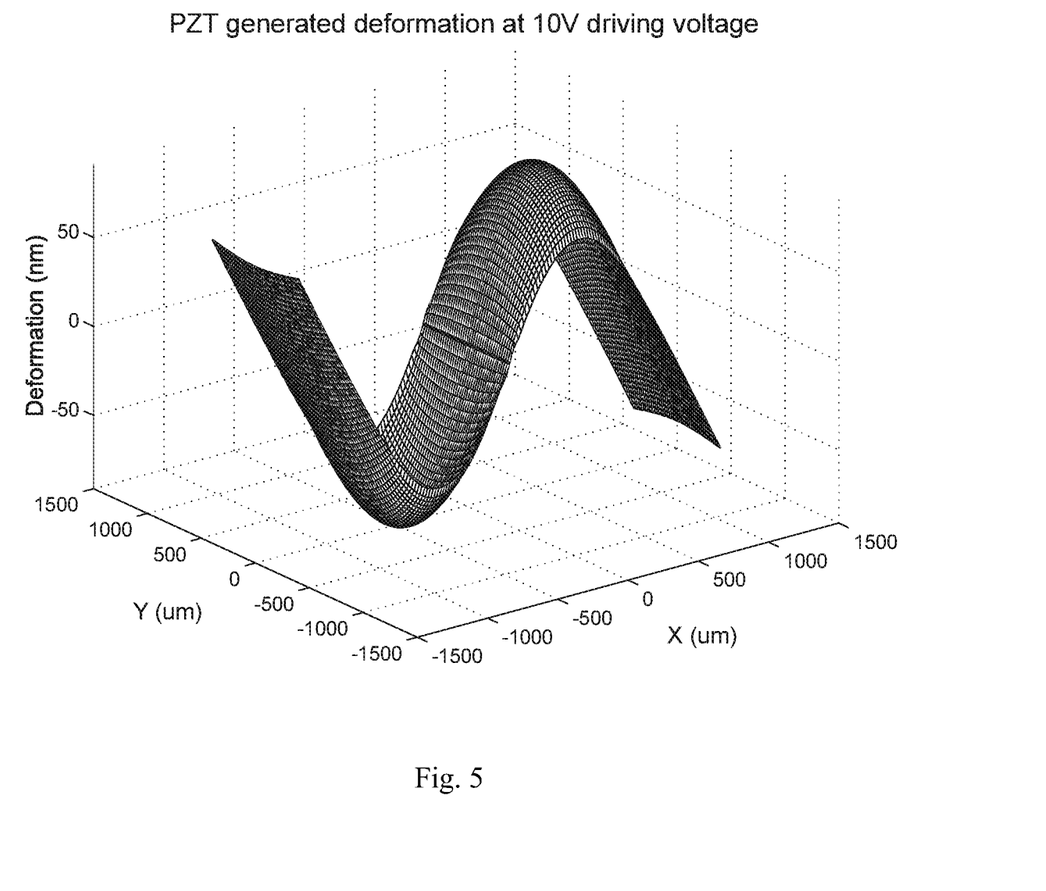
FIG. 5 shows deformation of a rectangular mirror by applying 10 volts driving voltages to piezoelectric elements in examples of the present disclosure.

FIG. 5 shows deformations of the rectangular mirror used in FIG. 4 by applying 10 volts driving voltages to piezoelectric elements in examples of the present disclosure. The maximum deformation is +/−91 nm.

Figure 6:
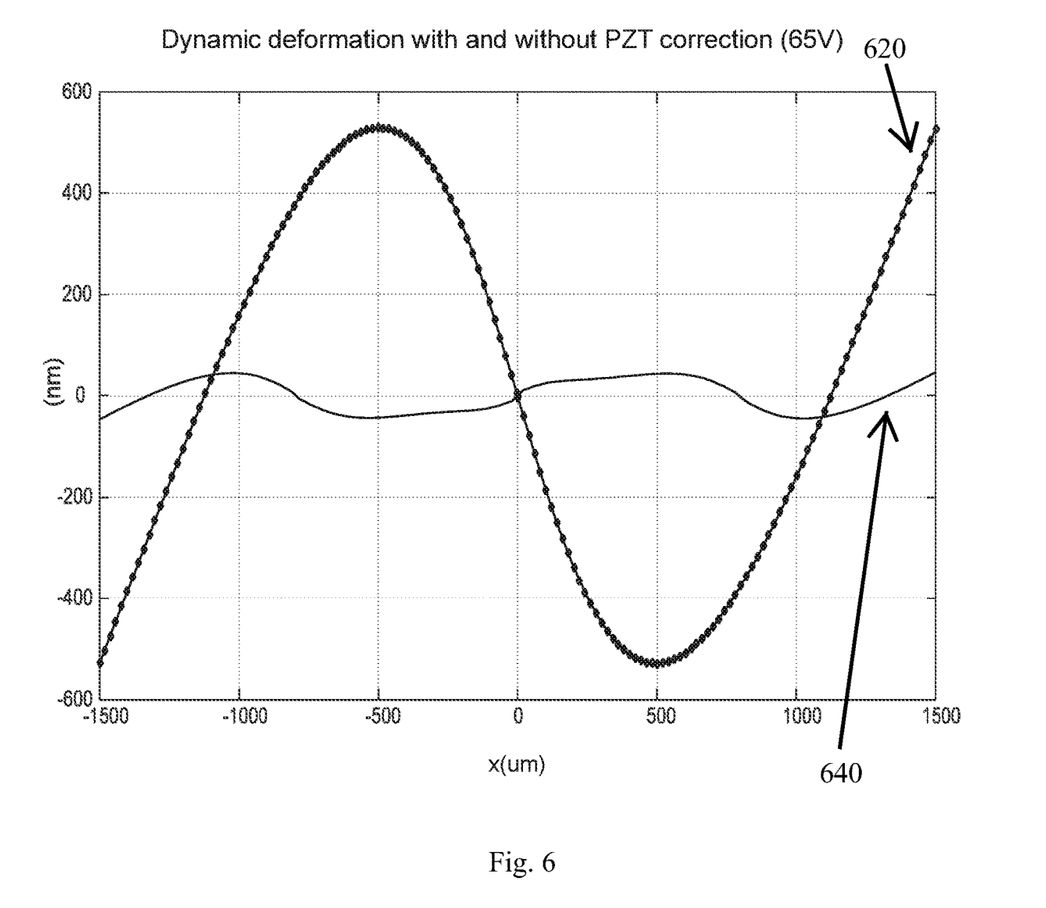
FIG. 6 shows dynamic deformations along a centerline of a rectangular mirror in examples of the present disclosure.

FIG. 6 shows dynamic deformations along a centerline of the rectangular mirror used in FIG. 4 in examples of the present disclosure. The mirror rotation angle is at 10 degrees. The piezoelectric element excitation voltage is +/−65 volts. The dynamic deformation along the centerline of the mirror without piezoelectric element excitation (shown in curve 620) is +/−529 nm. The dynamic deformation with piezoelectric element excitation (shown in curve 640) is +/−43 nm.

Those of ordinary skill in the art may recognize that modifications of the embodiments disclosed herein are possible. For example, the shape and the size of the mirror may vary. Other modifications may occur to those of ordinary skill in this art, and all such modifications are deemed to fall within the purview of the present invention, as defined by the claims.

The invention claimed is:

1. A scanner comprising:
a mirror to rotate about a first direction;
a first spring connected to the mirror;
a second spring connected to the mirror;
an insulation layer directly attached to the mirror and the first and second springs;
a first piezoelectric element directly attached to the insulation layer, the first piezoelectric element having
a first portion above the first spring;
a mid-range portion above the mirror; and
a second portion above the second spring; and
a second piezoelectric element directly attached to the insulation layer, the second piezoelectric element having
a first portion above the first spring;
a mid-range portion above the mirror; and
a second portion above the second spring;
wherein the first piezoelectric element comprises a first upper electrode layer;
a first piezoelectric layer; and
a first lower electrode layer;
wherein the second piezoelectric element comprises
a second upper electrode layer;
a second piezoelectric layer; and
a second lower electrode layer;
wherein the first piezoelectric element and the second piezoelectric element are symmetric with respect to the first direction;
wherein the first piezoelectric element is symmetric with respect to a second direction perpendicular to the first direction;
wherein the second piezoelectric element is symmetric with respect to the second direction; and
wherein the second direction is perpendicular to a thickness direction of the mirror under a mirror resting state.

2. A scanner comprising:
a mirror to rotate about a first direction;
a first spring connected to the mirror;
a second spring connected to the mirror;
an insulation layer directly attached to the mirror and the first and second springs;
a first piezoelectric element directly attached to the insulation layer, the first piezoelectric element having
a first portion above the first spring;
a mid-range portion above the mirror; and
a second portion above the second spring; and
a second piezoelectric element directly attached to the insulation layer, the second piezoelectric element having
a first portion above the first spring;
a mid-range portion above the mirror; and
a second portion above the second spring;
wherein the first piezoelectric element comprises a first upper electrode layer;
a first piezoelectric layer; and
a first lower electrode layer;
wherein the second piezoelectric element comprises a
second upper electrode layer;
a second piezoelectric layer; and
a second lower electrode layer;
wherein first upper electrode layer of the first piezoelectric element and second lower electrode layer of the second piezoelectric element are electrically and mechanically connected to a first electrode; and
wherein first lower electrode layer of the first piezoelectric element and the second upper electrode layer of the second piezoelectric element are electrically and mechanically connected to a second electrode.

3. A method of using the scanner of claim 2, the method comprising applying a first excitation voltage at the first electrode and a second excitation voltage at the second electrode, the first excitation voltage being a first function of time, and the second excitation voltage being a second function of time;
wherein the first excitation voltage and the second excitation voltage have a same frequency in a range from ninety-eight percent to one-hundred percent of a fundamental frequency of the mirror.

4. The method of claim 3, wherein a rotation of the mirror is characterized by
a positive rotation angle condition in which
the first piezoelectric element is under tension; and
the second piezoelectric element is under compression; and
a negative rotation angle condition in which
the first piezoelectric element is under compression; and
the second piezoelectric element is under tension.

5. A method of using the scanner of claim 2, the method comprising applying a first excitation voltage at the first electrode and a second excitation voltage at the second electrode;
wherein a difference between the first excitation voltage and the second excitation voltage is a function of a rotation angle of the mirror.

6. The method of claim 5, wherein the function includes a phase lead value or a phase lag value.

* * * * *